(12) United States Patent
Ryu et al.

(10) Patent No.: US 11,171,194 B2
(45) Date of Patent: Nov. 9, 2021

(54) DISPLAY APPARATUS

(71) Applicant: Samsung Display Co., Ltd., Yongin-si (KR)

(72) Inventors: Seungsoo Ryu, Yongin-si (KR);
Byoungyong Kim, Yongin-si (KR);
Sanghyeon Song, Yongin-si (KR);
Jeongdo Yang, Yongin-si (KR);
Jungyun Jo, Yongin-si (KR);
Seunghwa Ha, Yongin-si (KR);
Jeongho Hwang, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 15/616,658

(22) Filed: Jun. 7, 2017

(65) Prior Publication Data

US 2017/0373028 A1    Dec. 28, 2017

(30) Foreign Application Priority Data

Jun. 24, 2016    (KR) .................. 10-2016-0079286

(51) Int. Cl.
*H01L 27/32*        (2006.01)
*H01L 51/00*        (2006.01)
(Continued)

(52) U.S. Cl.
CPC ....... *H01L 27/3276* (2013.01); *G09G 3/2092* (2013.01); *H01L 24/05* (2013.01); *H01L 27/3255* (2013.01); *H01L 27/3288* (2013.01); *H01L 51/0097* (2013.01); *H01L 51/5203* (2013.01); *H01L 2224/0401* (2013.01);
(Continued)

(58) Field of Classification Search
CPC . H01L 24/05; H01L 27/3276; H01L 27/3255; H01L 2224/05083; H01L 2224/05017; H01L 2224/0401; H01L 2224/05124; H01L 2224/05166; H01L 2224/05025
See application file for complete search history.

(56) References Cited

U.S. PATENT DOCUMENTS 5,636,329 A *   6/1997   Sukegawa ........... G02F 1/13452
                                                          349/149
5,705,855 A     1/1998   Carson et al.
(Continued)

FOREIGN PATENT DOCUMENTS

EP       2966705 A1     1/2016
JP    2000-151057 A     5/2000
(Continued)

OTHER PUBLICATIONS

European Search Report corresponding to EP Application No. EP17176787, dated Nov. 9, 2017, 8 pages.

*Primary Examiner* — Matthew C Landau
*Assistant Examiner* — Dmitriy Yemelyanov
(74) *Attorney, Agent, or Firm* — Innovation Counsel LLP (57) ABSTRACT

A display apparatus is provided. The display apparatus includes a display substrate and a plurality of pads arranged above the display substrate. Each of the plurality of pads includes a first conductive layer, at least a portion of which is covered by an insulating film, a second conductive layer arranged above the first conductive layer, and a clamping portion formed in the second conductive layer.

23 Claims, 10 Drawing Sheets

(51) Int. Cl.
  *H01L 51/52* (2006.01)
  *G09G 3/20* (2006.01)
  *H01L 23/00* (2006.01)

(52) U.S. Cl.
  CPC ........... *H01L 2224/05017* (2013.01); *H01L 2224/05025* (2013.01); *H01L 2224/05083* (2013.01); *H01L 2224/05124* (2013.01); *H01L 2224/05166* (2013.01); *H01L 2224/05572* (2013.01); *H01L 2251/5338* (2013.01)

(56) References Cited

U.S. PATENT DOCUMENTS

| | | | |
|---|---|---|---|
| 5,705,885 | A | 1/1998 | Yamada et al. |
| 5,937,320 | A | 8/1999 | Andricacos et al. |
| 6,690,110 | B1 | 2/2004 | Yamada et al. |
| 7,019,393 | B2 | 3/2006 | Toriyama |
| 8,647,974 | B2 | 2/2014 | Topacio et al. |
| 2004/0217482 | A1* | 11/2004 | Wang ............. H01L 24/11 257/772 |
| 2005/0032349 | A1* | 2/2005 | Lee ............. H01L 24/05 438/614 |
| 2007/0075313 | A1* | 4/2007 | Kwak ............. H01L 27/124 257/59 |
| 2014/0327133 | A1 | 11/2014 | Lin |
| 2016/0070314 | A1* | 3/2016 | Takahashi ............. G09G 5/003 361/679.21 |

FOREIGN PATENT DOCUMENTS

| | | |
|---|---|---|
| KR | 10-1999-0082735 A | 11/1999 |
| KR | 10-2003-0059957 A | 7/2003 |
| KR | 10-2005-0020708 A | 3/2005 |
| KR | 10-2006-0134662 A | 12/2006 |
| KR | 10-2010-0120501 A | 11/2010 |
| KR | 10-2014-0012689 A | 2/2014 |
| TW | 541850 B | 7/2003 |

\* cited by examiner

DISPLAY APPARATUS

CROSS-REFERENCE TO RELATED APPLICATION

This application claims the benefit of Korean Patent Application No. 10-2016-0079286, filed on Jun. 24, 2016, in the Korean Intellectual Property Office, the disclosure of which is incorporated herein in its entirety by reference.

BACKGROUND

1. Field

One or more embodiments relate to a display apparatus.

2. Description of the Related Art

Display apparatuses may be used in mobile apparatuses such as smartphones, laptop computers, digital cameras, camcorders, portable information terminals, notebooks, and tablet personal computers (PCs), or electronic apparatuses such as desktop computers, televisions, outdoor billboards, and exhibition display apparatuses.

Recently, slimmer display apparatuses have been launched.

Flexible display apparatuses are easy to carry and are applicable to apparatuses having various shapes. Among them, a flexible display apparatus based on an organic light-emitting display technology is the most powerful flexible display apparatus.

In the display apparatus, a pad on a display panel may be electrically connected to a pad of a driver. If the pad on the display panel and the pad of the driver are not reliably connected to each other, the reliability of the display apparatus may be deteriorated.

SUMMARY

One or more embodiments include a display apparatus in which a pad and a driving terminal are reliably connected to each other.

Additional aspects will be set forth in part in the description which follows and, in part, will be apparent from the description, or may be learned by practice of the presented embodiments.

According to one or more embodiments, a display apparatus includes: a display substrate; and a plurality of pads arranged above the display substrate, wherein each of the plurality of pads includes: a first conductive layer, at least a portion of which is covered by an insulating film; a plurality of second conductive layers arranged above the first conductive layer; and a clamping portion formed in the second conductive layers.

The second conductive layer includes a plurality of second conductive layers which may be spaced apart from one another above the first conductive layer.

The insulating film may include a plurality of contact holes exposing top surfaces of the first conductive layer, and the plurality of second conductive layers may be electrically connected to the first conductive layer through the contact holes.

The clamping portion may include an undercut arranged on opposite sidewalls of adjacent second conductive layers.

The second conductive layer may include conductive portions of multiple layers, and the undercut may be provided by forming the conductive portions of multiple layers to have different widths.

The second conductive layer may include: a first conductive portion connected to the first conductive layer; a second conductive portion arranged above the first conductive portion; and a third conductive portion arranged above the second conductive portion, and the undercut corresponds to a region where a width of the second conductive portion may be narrower than a width of the first conductive portion and a width of the third conductive portion.

The second conductive layer may include a conductive portion of at least one layer, and the undercut may correspond to a region where a sidewall of the second conductive layer is inclined.

The second conductive layer may include a conductive portion of at least one layer, and the undercut may correspond to a region where a sidewall of the second conductive layer is curved.

The display apparatus may further include a third conductive layer arranged above the second conductive layer.

The second conductive layer may include a conductive portion of at least one layer, the display apparatus may further include a third conductive layer arranged above the second conductive layer, and a width of the second conductive layer in the undercut may be narrower than a width of the third conductive layer.

The display panel may include: at least one thin-film transistor including a semiconductor active layer, a gate electrode, a source electrode, and a drain electrode above the display substrate; an organic light-emitting display device electrically connected to the thin-film transistor, the organic light-emitting display device including a first electrode, an emission layer, and a second electrode; and an insulating film of at least one layer arranged between the thin-film transistor and the organic light-emitting display device, and the first conductive layer may be connected to a wiring extending from any one of the gate electrode, the source electrode, the drain electrode, the first electrode, and the second electrode, and the second conductive layer may be arranged to have an island shape above the first conductive layer.

The first conductive layer may be formed of a same material as the gate electrode, and the second conductive layer may be formed of a same material as the source electrode and the drain electrode.

The display apparatus may further include a third conductive layer disposed on the second conductive layer, wherein the first to third conductive layers may be a combination of a plurality of electrodes selected from the gate electrode, the source electrode, the drain electrode, the capacitor electrodes, the first electrode, and the second electrode.

According to one or more embodiments, a display apparatus includes: a display panel including a display substrate in which a plurality of pads are arranged, and a thin-film encapsulation layer arranged above the display substrate; a driver including a plurality of driving terminals electrically connected to the plurality of pads; and an adhesive arranged between the plurality of pads and the driver, wherein each of the plurality of pads includes: a first conductive layer, at least a portion of which is covered by an insulating film; a plurality of second conductive layers arranged above the first conductive layer; and a clamping portion arranged between adjacent second conductive layers.

The insulating film may include a plurality of contact holes exposing top surfaces of the first conductive layers, and the second conductive layers may be electrically connected to the first conductive layers through the contact holes, respectively.

The clamping portion may include an undercut arranged on opposite sidewalls of the adjacent second conductive layers.

The driving terminal may fill a gap between the adjacent second conductive layers and contact a sidewall of the second conductive layer in which the undercut is arranged.

The driving terminal may extend over a region where the first conductive layer contacts the second conductive layer and between the adjacent second conductive layers.

The each of the plurality of pads may be in surface contact with the driving terminal. The adhesive may include a non-conductive film.

According to one or more embodiments, a display apparatus includes: a display panel comprising a display substrate in which a plurality of pads are arranged; and a driver comprising a plurality of driving terminals electrically connected to the plurality of pads, respectively, wherein each of the plurality of pads comprises: a first conductive layer; an insulating layer disposed on the first conductive layer, and a second conductive layer disposed on the insulating layer and connected to the first conductive layer through a contact hole formed in the insulating layer, and wherein the second conductive layer includes a clamping portion having an undercut and one of the plurality of driving terminals fills the undercut.

The second conductive layer may include a first conductive portion and a second conductive portion disposed on the first conductive portion, and the undercut may be formed in the first conductive portion.

The undercut may have a recessed portion recessed from an edge of the second conductive portion and the recessed portion may be from about 1 μm to about 20 μm.

The clamping portion may be formed at a center of the second conductive layer.

The second conductive layer may include a plurality of second conductive layers disposed on the first conductive layer, and the clamping portion may be formed between adjacent second conductive layers.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Various alterations and modifications may be made to embodiments, some of which will be illustrated in detail in the drawings and detailed description. However, it should be understood that these embodiments are not construed as limited to the illustrated forms and include all changes, equivalents, or alternatives within the idea and the technical scope of the inventive concept. However, in the following descriptions and the accompanying drawings, descriptions of well-known functions and constructions will be omitted if they are considered to unnecessarily obscure the gist of the inventive concept.

It will be understood that although the terms "first", "second", etc. may be used herein to describe various components, these components should not be limited by these terms. These components are only used to distinguish one component from another.

The terminology used herein is for the purpose of describing particular embodiments only and is not intended to limit the scope of the inventive concept. As used herein, the singular forms "a", "an", and "the" are intended to include the plural forms as well, unless the context clearly indicates otherwise. It will be understood that the terms "comprise", "include", and "have" used herein specify the presence of stated features, integers, steps, operations, elements, components, or combinations thereof, but do not preclude the presence or addition of one or more other features, integers, steps, operations, elements, components, or combinations thereof.

Hereinafter, a display apparatus according to one or more embodiments will be described in detail with reference to the accompanying drawings. Like reference numerals are assigned to like elements throughout the drawings and the specification, and redundant descriptions thereof will be omitted.

Figure 1:
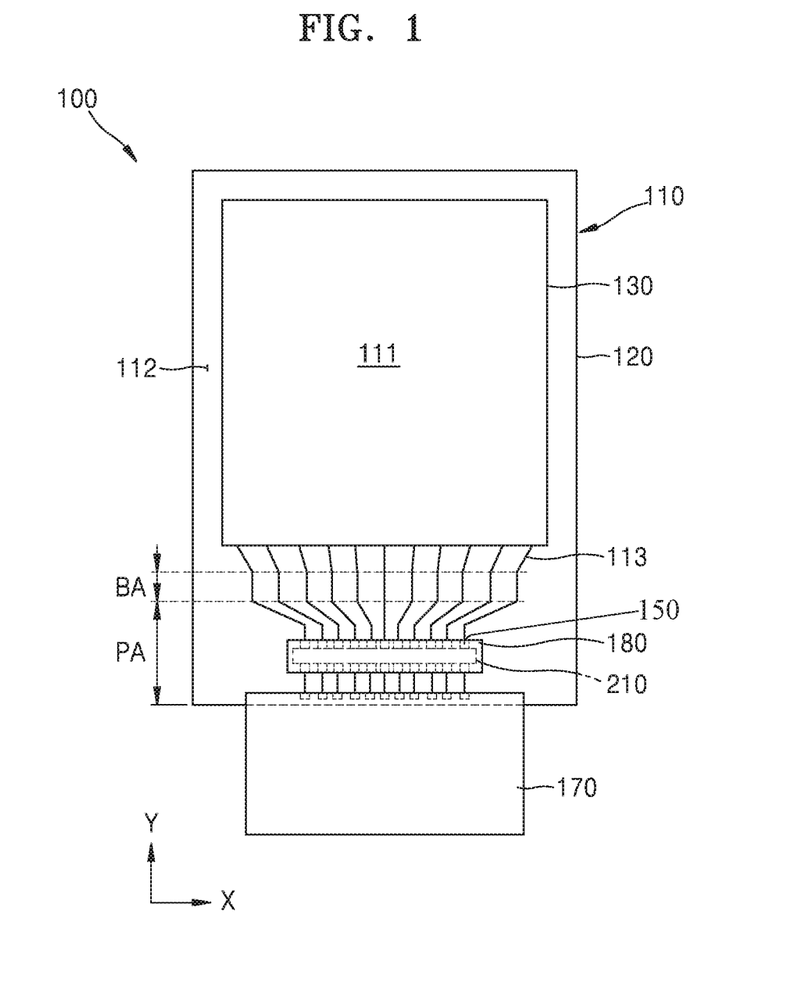
FIG. 1 is plan view of a display apparatus according to an embodiment.
Figure 2:
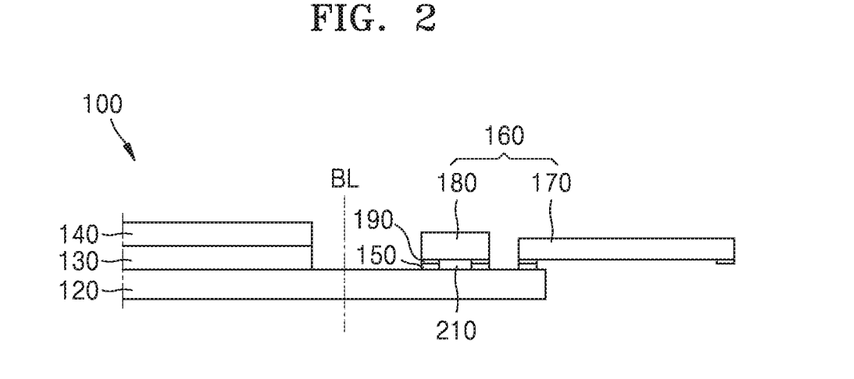
FIG. 2 is a cross-sectional view of the display apparatus of FIG. 1.

FIG. 1 is a plan view of a display apparatus 100 according to an embodiment, and FIG. 2 is a cross-sectional view of the display apparatus 100 of FIG. 1.

Referring to FIGS. 1 and 2, the display apparatus 100 includes a display panel 110. According to an embodiment, the display apparatus 100 may be an organic light-emitting display device (OLED). According to another embodiment, the display apparatus 100 may be a liquid crystal display (LCD), a field emission display (FED), or an electrophoretic display (EPD).

The display panel 110 may include a display substrate 120 including a plurality of elements, and a thin-film encapsulation (TFE) layer 130 arranged above the display substrate 120. A plurality of thin-film transistors and a plurality of light-emitting elements respectively connected to the plurality of thin-film transistors may be arranged above the display substrate 120. A functional film 140, such as a polarizing layer, a touchscreen, and a cover window, may be arranged above the TFE layer 130.

The display panel 110 may have an active area (AA) 111 on which an image is displayed, and an inactive area (IAA) 112 surrounding the active area 111.

The TFE layer 130 may cover the active area 111.

The inactive area 112 surrounds the active area 111. The inactive area 112 may have a bending area BA in which the display panel 110 may be bent and a pad area PA disposed outside of the bending area BA.

The display panel 110 may be bendable along a bending line BL that is a reference line in the bending area BA.

The pad area PA may be arranged at one edge of the display substrate 120. A plurality of pads 150 may be arranged in the pad area PA. The plurality of pads 150 may be spaced apart from one another in an X direction of the display substrate 120. The pads 150 may be connected to wirings 113 extending from the active area 111.

A driver 160 may be electrically connected to the plurality of pads 150.

The driver 160 may include a driving circuit and may be a chip on plastic (COP). The driver 160 includes a flexible printed circuit board (PCB) 170 in which circuit wirings are patterned, a driving integrated circuit (IC) 180 arranged above the display substrate 120, and a plurality of driving terminals 190 arranged under the driving IC 180. The flexible PCB 170 may be electrically connected to the driving IC 180. The flexible PCB 170 may be electrically connected to an external board (not illustrated).

According to another embodiment, the driver 160 may be a chip on film (COF). According to another embodiment, the driver 160 may be a chip on glass (COG).

The plurality of pads 150 may be electrically connected to the plurality of driving terminals 190. The plurality of pads 150 may be directly electrically connected to the plurality of driving terminals 190.

An adhesive 210 may be arranged between the plurality of pads 150 and the plurality of driving terminals 190. The adhesive 210 may provide an adhesive force between the plurality of pads 150 and the plurality of driving terminals 190. The adhesive 210 may be arranged around a region where the plurality of pads 150 are connected to the plurality of driving terminals 190.

Specifically, when the plurality of pads 150 are connected to the plurality of driving terminals 190, the adhesive 210 may flow toward the periphery of the region where the plurality of pads 150 are connected to the plurality of driving terminals 190. Accordingly, the adhesive 210 may not be present in the region where the plurality of pads 150 are directly connected to the plurality of driving terminals 190 through the adhesive 210.

The display apparatus 100 having the above-described structure may electrically connect the pads 150 to the driving terminals 190 by using a pressure device such as a hot bar. The case where the pads 150 above the display substrate 120 are connected to the driving terminals 190 of the driver 160 has been described above, the present embodiment may be applied to any structure in which terminals arranged in different components are directly connected to one another.

According to an embodiment, the plurality of pads 150 may be arranged on the same plane above the display substrate 120.

According to an embodiment, each of the plurality of pads 150 includes at least one conductive layer.

According to an embodiment, the plurality of pads 150 may be arranged on different lines above the display substrate 120.

According to an embodiment, the plurality of pads 150 arranged on the different lines may be alternately arranged. For example, the plurality of pads 150 may be in a zigzag arrangement.

Figure 3:
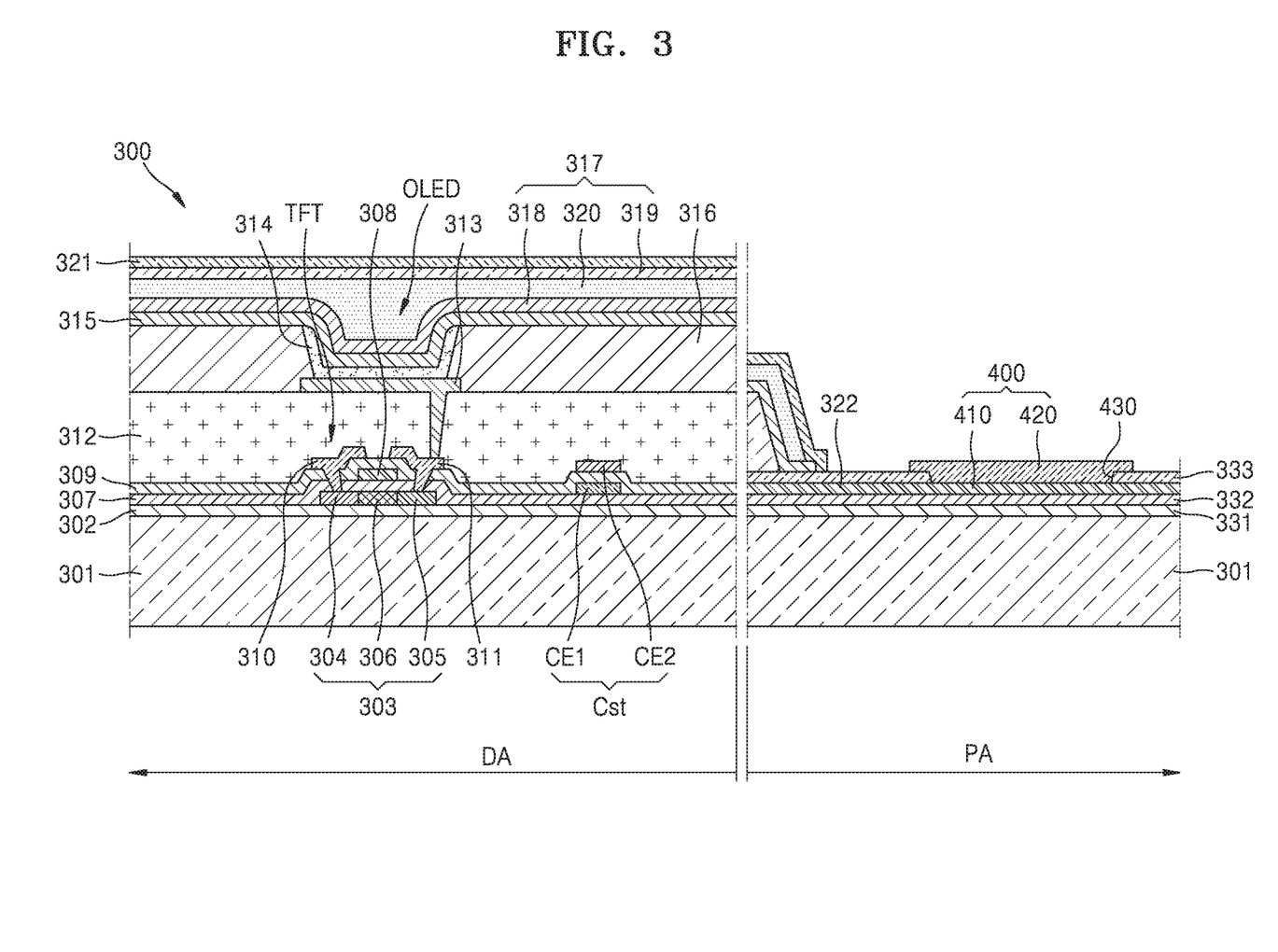
FIG. 3 is a cross-sectional view of a display panel according to an embodiment.
Figure 4:
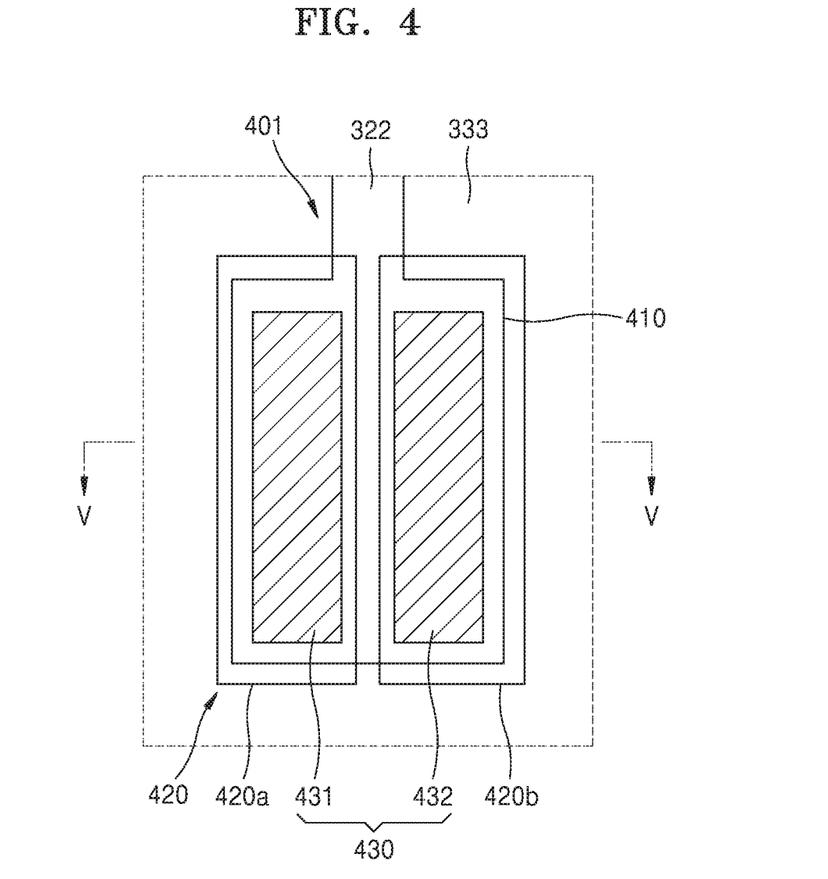
FIG. 4 is a plan view of a pad on a display pad of FIG. 3.
Figure 5:
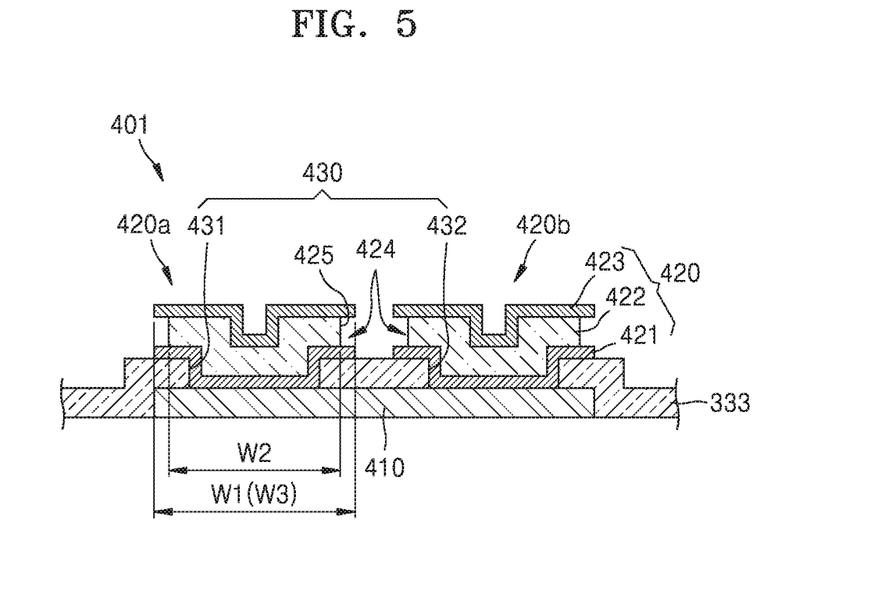
FIG. 5 is a cross-sectional view taken along line V-V of FIG. 4.

FIG. 3 is a cross-sectional view of a display panel 300 according to an embodiment, FIG. 4 is a plan view of one pad of FIG. 3, and FIG. 5 is a cross-sectional view taken along line V-V of FIG. 4.

Referring to FIGS. 3 to 5, the display panel 300 includes a display substrate 301 and a TFE layer 317. According to an embodiment, the display panel 300 may be an OLED panel.

The display panel 300 may have a display area DA arranged in an active area AA, and a pad area PA arranged in an inactive area IAA. A pad 400 may be arranged in the pad area PA.

The display substrate 301 may be a flexible glass substrate, a flexible polymer substrate, a rigid glass substrate, or a rigid polymer substrate. The display substrate 301 may be transparent, semitransparent, or opaque.

A barrier film 302 may be arranged above the display substrate 301. The barrier film 302 may cover the display substrate 301. The barrier film 302 may be an organic film or an inorganic film. The barrier film 302 may be a single film or a multi-layer film.

At least one thin-film transistor TFT and at least one capacitor Cst may be arranged above the display area DA. According to an embodiment, the number of thin-film transistors TFT and the number of capacitors Cst are not limited.

A semiconductor active layer 303 may be arranged above the barrier film 302. The semiconductor active layer 303 includes a source region 304 and a drain region 305 arranged by doping N-type impurity ions or P-type impurity ions. A channel region 306 into which impurities are not doped may be disposed between the source region 304 and the drain region 305. The semiconductor active layer 303 may be an organic semiconductor or an inorganic semiconductor such as an amorphous silicon, a polysilicon and an oxide semiconductor.

A gate insulating film 307 may be arranged above the semiconductor active layer 303. The gate insulating film 307 may be an inorganic film. The gate insulating film 307 may be a single film or a multi-layer film.

A gate electrode 308 may be arranged above the gate insulating film 307. The gate electrode 308 may include a conductive material having conductivity, for example, metal such as molybdenum (Mo), aluminum (Al), copper (Cu) and titanium (Ti). The gate electrode 308 may be a single film or a multi-layer film.

An interlayer insulating film 309 may be arranged above the gate electrode 308. The interlayer insulating film 309 may be an organic film or an inorganic film.

A source electrode 310 and a drain electrode 311 may be arranged above the interlayer insulating film 309. Contact holes may be formed by removing portions of the gate insulating film 307 and portions of the interlayer insulating film 309. The source electrode 310 may be electrically connected to the source region through one of the contact holes, and the drain electrode 311 may be electrically connected to the drain region 305 through one of the contact holes.

The source electrode 310 and the drain electrode 311 may include a conductive material having conductivity. For example, the source electrode 310 and the drain electrode 311 includes metal such as Mo, Al, Cu and Ti. The source electrode 310 and the drain electrode 311 may be a single film or a multi-layer film. For example, the source electrode 310 and the drain electrode 311 may have a stack structure including Ti/Al/Ti.

A protective film 312 may be arranged above the source electrode 310 and the drain electrode 311. The protective film 312 may be an organic film or an inorganic film. The protective film 312 may include a passivation film and a planarization film. Either of the passivation film and the planarization film may be omitted.

The capacitor Cst includes a first capacitor electrode CE1, a second capacitor electrode CE2, and a dielectric layer arranged therebetween. According to the present embodiment, the dielectric layer may correspond to the interlayer insulating film 309. The first capacitor electrode CE1 may include the same material as the gate electrode 308 and may be arranged on the same plane as the gate electrode 308. The second capacitor electrode CE2 may include the same material as the source electrode 310 and the drain electrode 311 and may be arranged on the same plane as the source electrode 310 and the drain electrode 311. The protective film 312 may cover the second capacitor electrode CE2.

According to another embodiment, the capacitor Cst may overlap the thin-film transistor TFT.

Figure 11:
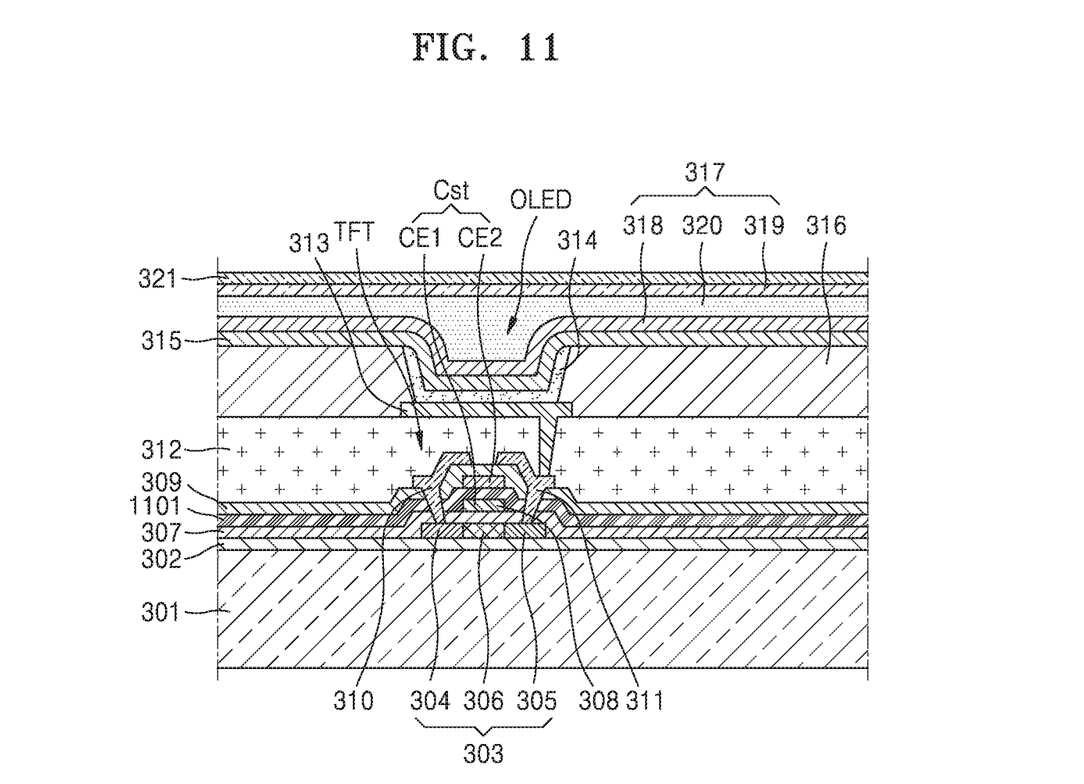
FIG. 11 is a cross-sectional view of one sub-pixel of a display panel, according to another embodiment.

For example, referring to FIG. 11, the gate electrode 308 of the thin-film transistor TFT may function as the first capacitor electrode CE1. The second capacitor electrode CE2 may overlap the first capacitor electrode CE1, with the dielectric layer 1101 being arranged therebetween. The second capacitor electrode CE2 may include a conductive material having conductivity, for example, metal. The second capacitor electrode CE2 includes Mo, Al, Cu, or Ti. The second capacitor electrode CE2 may be a single film or a multi-layer film.

Referring to FIGS. 3, 4, and 5 again, the thin-film transistor TFT may be electrically connected to an OLED.

The OLED may be arranged above the protective film 312. The OLED includes a first electrode 313, an intermediate layer 314, and a second electrode 315.

The first electrode 313 may function as an anode and may include various conductive materials. The first electrode 313 may include a transparent electrode or a reflective electrode. For example, when the first electrode 313 is the transparent electrode, the first electrode 313 includes a transparent conductive film. When the first electrode 313 is the reflective electrode, the first electrode 313 includes a reflective film and a transparent conductive film arranged above the reflective film.

A pixel defining layer 316 may be arranged above the protective film 312. The pixel defining layer 316 may cover a portion of the first electrode 313. The pixel defining layer 316 surrounds an edge of the first electrode 313 to define an emission region of each sub-pixel. The first electrode 313 may be patterned in each sub-pixel. The pixel defining layer 316 may be an organic film or an inorganic film. The pixel defining layer 316 may be a single film or a multi-layer film.

The intermediate layer 314 may be arranged above the first electrode 313 in a region corresponding to the first electrode 313 exposed by etching a part of the pixel defining layer 316. The intermediate layer 314 may be formed by a deposition process.

The intermediate layer 314 may include an organic emissive layer.

According to alternative examples, the intermediate layer 314 may include an organic emissive layer and may further include a hole injection layer (HIL), a hole transport layer (HTL), an electron transport layer (ETL), and an electron injection layer (EIL).

According to an embodiment, the intermediate layer 314 may include an organic emissive layer and may further include various functional layers.

The second electrode 315 may be arranged above the intermediate layer 314.

The second electrode 315 may function as a cathode. The second electrode 315 may include a transparent electrode or a reflective electrode. For example, when the second electrode 315 is the transparent electrode, the second electrode 315 includes a metal film and a transparent conductive film arranged above the metal film. When the second electrode 315 is the reflective electrode, the second electrode 315 includes a metal film.

According to an embodiment, a plurality of sub-pixels may be arranged above the display substrate 301. For example, a red color sub-pixel, a green color sub-pixel, a blue color sub-pixel, or a white color sub-pixel may be formed on the display substrate 301. However, the present disclosure is not limited thereto.

The TFE layer 317 may cover the OLED.

The TFE layer 317 may include first and second inorganic films 318 and 319 and an organic film 320 alternately stacked. For example, the first inorganic film 318, the organic film 320, and the second inorganic film 319 may be sequentially stacked above the OLED. The stack structure of the inorganic films and the organic film included in the TFE layer 317 may be variously modified.

A polarizing layer 321 may be arranged above the TFE layer 317. The polarizing layer 321 may reduce external light reflection. According to another embodiment, the polarizing layer 321 may be omitted, and external light reflection may be reduced by using a black matrix and a color filter.

A plurality of pads 400, which are electrically connected to driving terminals, may be arranged in the pad area PA. Each pad 401 of the plurality of pads 400 may be spaced apart in one direction of the display substrate 301.

Each pad 401 of the plurality of pads 400 may include a first conductive layer 410 and a second conductive layer 420 arranged above the first conductive layer 410.

Details thereof will be described below.

A first insulating film 331 may be arranged above the display substrate 301 in the pad area PA. The first insulating film 331 may be arranged on the same plane as the barrier film 302. The first insulating film 331 and the barrier film 302 may be formed in the same process by using the same material.

A second insulating film 332 may be arranged above the first insulating film 331. The second insulating film 332 may be arranged on the same plane as the gate insulating film 307. The second insulating film 332 and the gate insulating film 307 may be formed in the same process by using the same material.

The first conductive layer 410 included in each pad 401 may be arranged above the second insulating film 332. The first conductive layer 410 may be electrically connected to a wiring 322 extending from the gate electrode 308. The first conductive layer 410 may be arranged on the same plane as the gate electrode 308. The first conductive layer 410 and the gate electrode 308 may be formed in the same process by using the same material. The first conductive layers 410 may be spaced apart from one another in one direction of the display substrate 301.

A third insulating film 333 may be arranged above the first conductive layer 410. The third insulating film 333 may be arranged on the same plane as the interlayer insulating film 309. The third insulating film 333 and the interlayer insulating film 309 may be formed in the same process by using the same material.

The third insulating film 333 may cover at least a portion of the first conductive layer 410. A plurality of contact holes 430 may be formed above the first conductive layer 410 by removing portions of the third insulating film 333. Top surfaces of the first conductive layers 410 may be exposed to the outside in a region where the contact holes 430 are formed.

The contact holes 430 include a first contact hole 431 and a second contact hole 432 arranged adjacent to the first contact hole 431. The case where two contact holes 430 are arranged above the first conductive layer 410 has been described above, but embodiments are not limited as long as the number of contact holes 430 are two or more.

A plurality of second conductive layers 420 may be arranged above the exposed region of the first conductive layer 410. The second conductive layer 420 may be electrically connected to the first conductive layer 410 through the contact hole 430.

The plurality of second conductive layers 420 may be respectively arranged in the plurality of contact holes 430. For example, one second conductive layer 420a may be arranged above the first contact hole 431, and another second conductive layer 420b may be arranged above the second contact hole 432. The plurality of second conductive layers 420a and 420b may be spaced apart from each other above the first conductive layer 410. However, the plurality of second conductive layers 420a and 420b may be connected to each other above the first conductive layer 410.

The plurality of second conductive layers 420 may be arranged to have an island shape above the first conductive layer 410. According to another embodiment, the second conductive layer 420 may be electrically connected to a wiring extending from the display area DA.

The second conductive layer 420 may be arranged on the same plane as the source electrode 310 and the drain electrode 311. The second conductive layer 420, the source electrode 310, and the drain electrode 311 may be formed in the same process by using the same material.

The second conductive layer 420 may have a multi-layered structure. According to an embodiment, the second conductive layer 420 includes conductive portions of multiple layers. The second conductive layer 420 includes a first conductive portion 421, a second conductive portion 422, and a third conductive portion 423.

The first conductive portion 421 may be arranged above the first conductive layer 410. The first conductive portion 421 includes Ti. The first conductive portion 421 may be directly connected to the first conductive layer 410. The second conductive portion 422 may be arranged above the first conductive portion 421. The second conductive portion 422 includes Al. The third conductive portion 423 may be arranged above the second conductive portion 422. The third conductive portion 423 includes Ti. The case where the second conductive layer 420 has the stack structure including Ti/Al/Ti has been described above, but the stack structure of the second conductive layer 420 may be variously modified.

A clamping portion 424, which is connected to at least a portion of a driving terminal (640 of FIG. 6A) of a driver, may be arranged between the adjacent second conductive layers 420a and 420b included in the second conductive layer 420. A clamping portion 424 may be formed on the third insulating film 333 to fully overlap with the third insulating film 333 in a plan view The clamping portion 424 includes an undercut 425 formed in the adjacent second conductive layers 420a and 420b.

The undercut 425 may be provided by forming the first conductive portion 421, the second conductive portion 422, and the third conductive portion 423 to have different widths. The undercut 425 may be formed in the second conductive portion 422 where a width W2 of the second conductive portion 422 is narrower than a width W1 of the first conductive portion 421 and a width W3 of the third conductive portion 423 by from about 1 μm to about 20 μm. The width W1 of the first conductive portion 421 may be substantially equal to the width W3 of the third conductive portion 423.

The second conductive layer 420 may be patterned by an etching process. When the second conductive layer 420 is etched, an etch rate of the first conductive portion 421 and the third conductive portion 423 may be different from an etch rate of the second conductive portion 422. For example, an etch rate of the second conductive portion 422 including Al may be larger than an etch rate of the first conductive portion 421 and the third conductive portion 423 each including Ti. Accordingly, the undercut 425 may be formed on opposite sidewalls of the adjacent second conductive layers 420a and 420b so that the second conductive portion 422 has a recessed portion.

The driving terminal (640 of FIG. 6A) of the driver may be strongly connected to the pad 400 having the above-described structure.

Figure 6A:
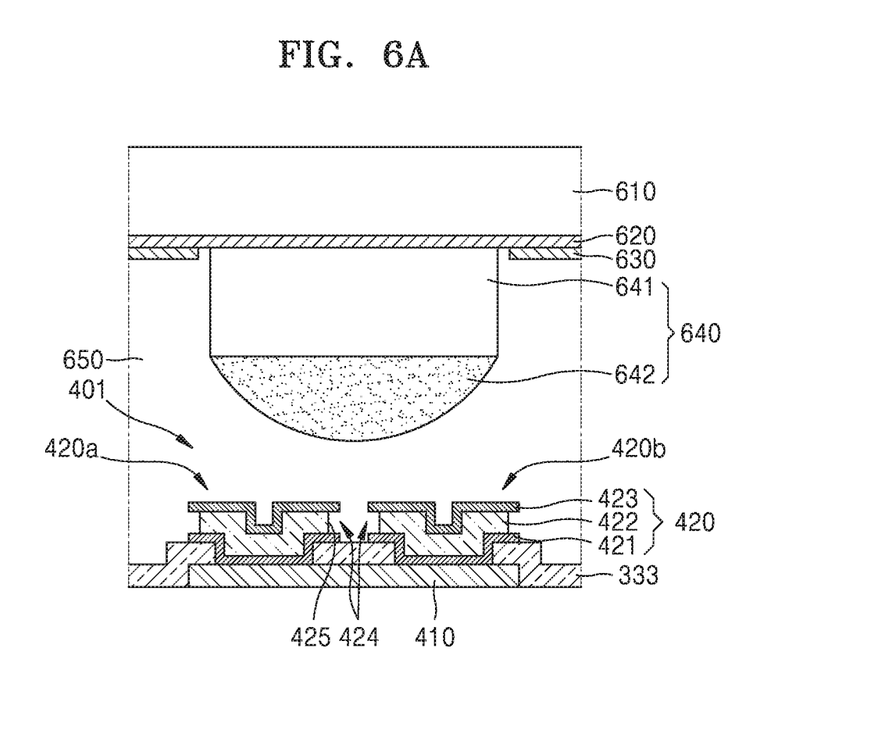
FIG. 6A is a cross-sectional view illustrating a state before a driving terminal is connected to a pad on a display panel of FIG. 5.
Figure 6B:
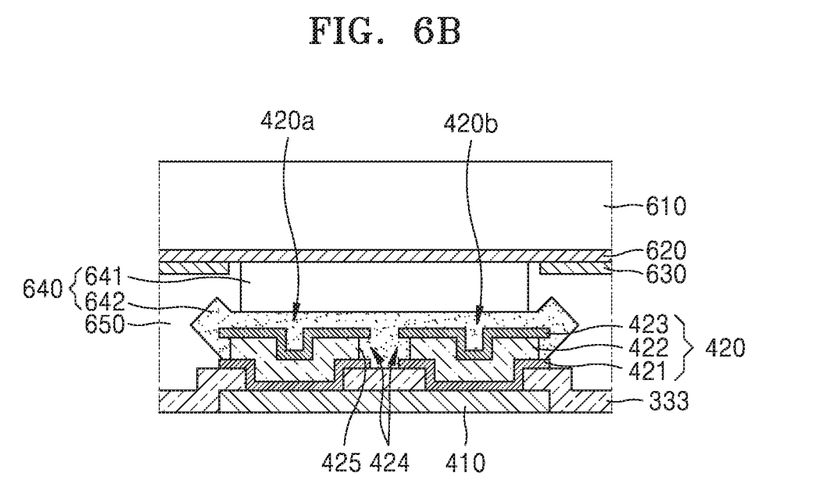
FIG. 6B is a cross-sectional view illustrating a state when a driving terminal is connected to a pad of FIG. 6A.

FIG. 6A is a cross-sectional view illustrating a state before the driving terminal 640 is connected to the pad 400 of FIG. 5, and FIG. 6B is a cross-sectional view illustrating a state when the driving terminal 640 is connected to the pad 400 of FIG. 6A.

Referring to FIG. 6A, a driving IC 610 may be arranged above the pad 400. A circuit pattern 620 may be arranged under the driving IC 610. An insulating film 630 may cover a portion of the circuit pattern 620. The driving terminal 640 may be electrically connected to the circuit pattern 620. The driving terminal 640 includes a bump 641. The bump 641 may include gold (Au), Cu, and indium (In). A solder layer 642 may be further arranged at the tip of the bump 641. According to an embodiment, the melting layer 642 may be a solder layer.

An adhesive 650 may be arranged between the pad 400 and the driving terminal 640. The adhesive 650 may be a non-conductive film (NCF). The adhesive 650 may not include a conductive material. The adhesive 650 may provide an adhesive force between the pad 400 and the driving terminal 640. The adhesive 650 may be arranged around a region where each pad 401 of the plurality of pads 400 is connected to each driving terminal 640 corresponding thereto.

The attachment of the pad 400 and the bump 641 may be performed using a thermo-compression bonding process. When a certain heat and pressure are applied from above the driving IC 610 by using a thermo-compression bonding process apparatus such as a hot bar, the solder layer 642 provided in the bump 641 is melted so that the pad 400 is electrically connected (or bonded) to the driving terminal 640, as illustrated in FIG. 6B.

After the bonding, delamination may occur between the pad 401 and the driving terminal 640 due to moisture absorption of the adhesive 650 arranged around a region where each pad 401 of the plurality of pad 400 is connected to the driving terminal 640 corresponding thereto.

According to the present embodiment, since the clamping portion 424 including the undercut 425 is arranged on the opposite sidewalls of the adjacent second conductive layers 420a and 420b included in the second conductive layer 420, each pad 401 of the pads 400 may be tightly bonded to the driving terminal 640 corresponding thereto.

During the bonding, the solder layer 642 provided in the bump 641 flows into the undercut 425 arranged on the opposite sidewalls of the adjacent second conductive layers 420a and 420b. The solder layer 642 may fill a gap between the adjacent second conductive layers 420a and 420b and may contact the opposite sidewalls of the adjacent second conductive layers 420a and 420b.

According to an embodiment, the solder layer 642 provided on the bump 641 may extend over a region where the first conductive layer 410 contacts the second conductive layer 420 and between the adjacent second conductive layers 420a and 420b.

According to an embodiment, the solder layer 642 provided on the bump 641 may completely cover the adjacent second conductive layers 420a and 420b.

According to an embodiment, each pad 401 is in surface contact with the driving terminal 640 corresponding thereto through the solder layer 642 provided in the bump 641. Because the solder layer 642 fills the undercut between adjacent second conductive layer 420a and 420b, a contact resistance between the pad 400 and the driving terminal 640 may be reduced.

Subsequently, if a curing process is performed, the pad 401 may be strongly connected to the driving terminal 640.

According to an embodiment, the pad 400 may be modified to have various shapes as long as the melting layer 642 provided in the bump 641 can fill the undercut between the conductive layers.

Figures 12, 13:
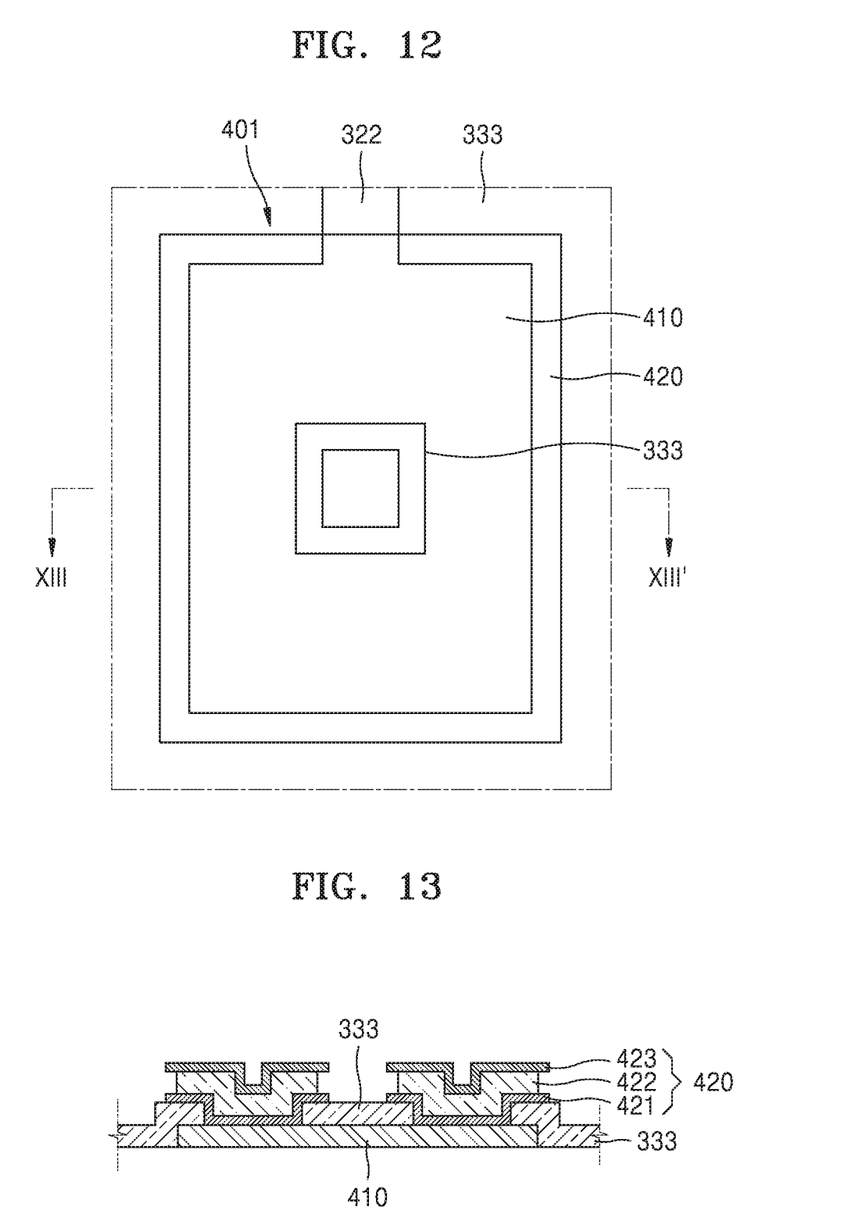
FIG. 12 is a plan view of one pad according to an embodiment.
FIG. 13 is a cross-sectional view taken along line XIII-XIII' of FIG. 12.

FIG. 12 is a plan view of one pad according to an embodiment and FIG. 13 is a cross-sectional view taken along line XIII-XIII' of FIG. 12. Referring to FIGS. 12 and 13, the second conductive layer 420 is formed in one piece and has a removed portion at the center.

Figure 14:
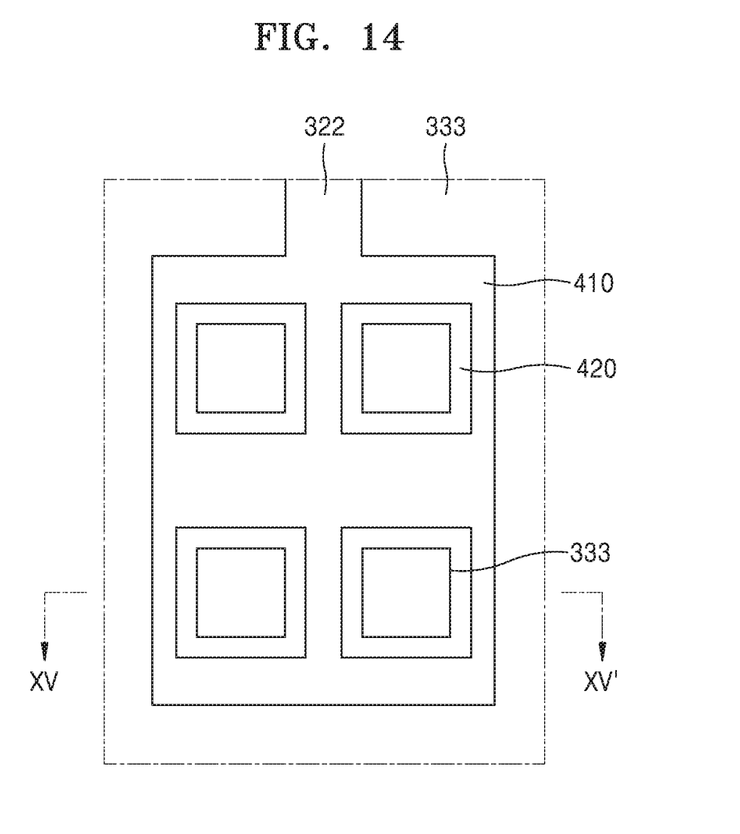
FIG. 14 is a plan view of one pad according to an embodiment.
Figure 15:
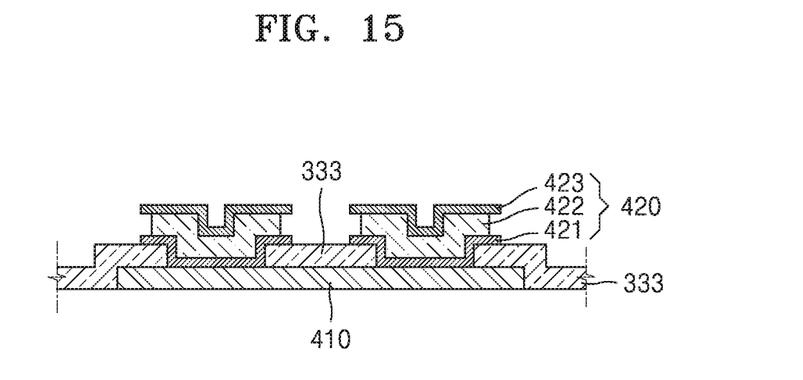
FIG. 15 is a cross-sectional view taken along line XV-XV' of FIG. 14.

FIG. 14 is a plan view of one pad according to an embodiment and FIG. 15 is a cross-sectional view taken along line XV-XV' of FIG. 14. Referring to FIGS. 14 and 15, a plurality of isolated second conductive layers 420 are arranged in a matrix configuration on the first conductive layer 410.

Figure 16:
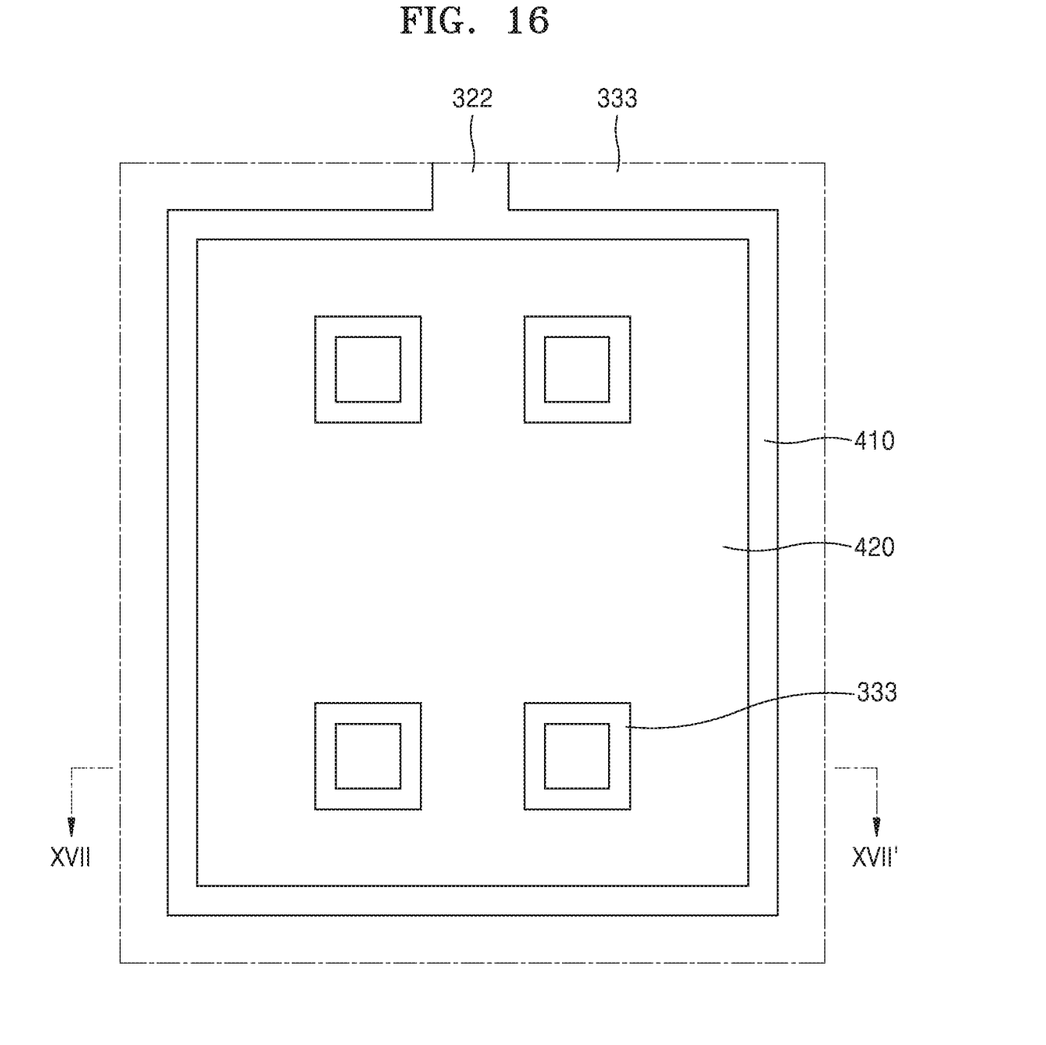
FIG. 16 is a plan view of one pad according to an embodiment.
Figure 17:
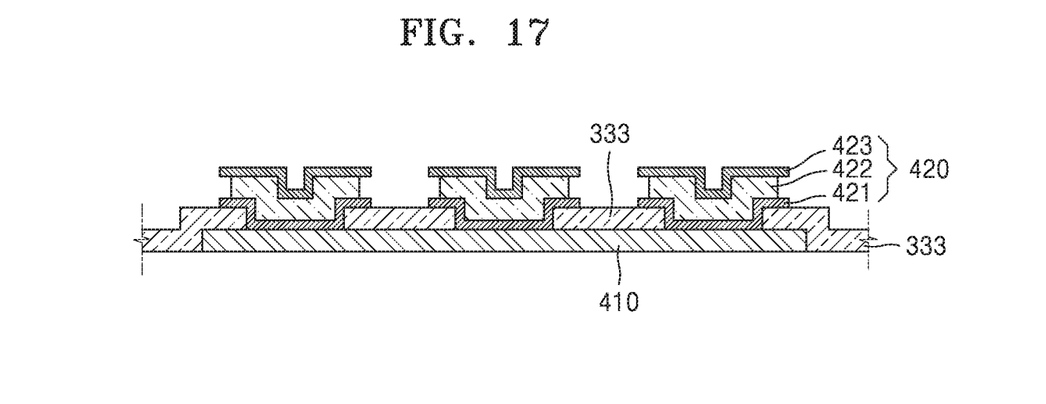
FIG. 17 is a cross-sectional view taken along line XVII-XVII' of FIG. 16.

FIG. 16 is a plan view of one pad according to an embodiment and FIG. 17 is a cross-sectional view taken along line XVII-XVII' of FIG. 16. Referring to FIGS. 16 and 17, the second conductive layer 420 is formed as a mesh shape and has a plurality of removed portions arranged in a matrix shape on the first conductive layer 410.

Hereinafter, clamp portions connected to at least a part of the driving terminal 640, according to various embodiments, will be described.

Figure 7:
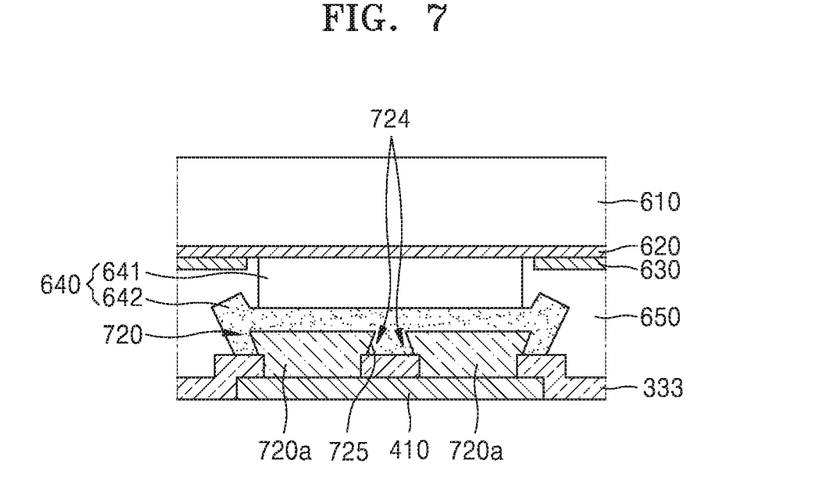
FIGS. 7 to 10 are cross-sectional views illustrating states when a driving terminal is connected to a pad on a display panel, according to embodiments.

Referring to FIG. 7, a clamping portion 724, which is connected to at least a portion of the driving terminal 640, may be arranged between adjacent second conductive layers 720a and 720b included in a second conductive layer 720. The clamping portion 724 includes an undercut 725 arranged on opposite sidewalls of the adjacent second conductive layers 720a and 720b. The first conductive layer 410 may be arranged on the same plane as the gate electrode 308 of FIG. 3. The second conductive layer 720 may be arranged on the same plane as the source electrode 310 and the drain electrode 311 of FIG. 3.

The second conductive layer 720 may be a single film or a multi-layer film. For example, the second conductive layer 720 includes a conductive portion of at least one layer. The undercut 725 may correspond to a region where the sidewall of the second conductive layer 720 is inclined.

According to an embodiment, the second conductive layer 720 may have a reverse tapered shape.

Figure 8:
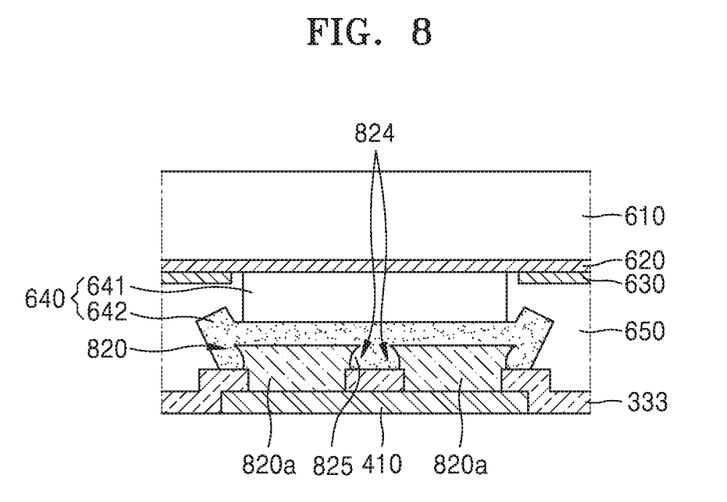

Referring to FIG. 8, a clamping portion 824 may be arranged between adjacent second conductive layers 820a and 820b included in a second conductive layer 820. The clamping portion 824 includes an undercut 825 arranged on opposite sidewalls of the adjacent second conductive layers 820a and 820b.

The second conductive layer 820 includes a conductive portion of at least one layer. The undercut 825 may correspond to a region where the sidewall of the second conductive layer 820 is curved.

Figure 9:
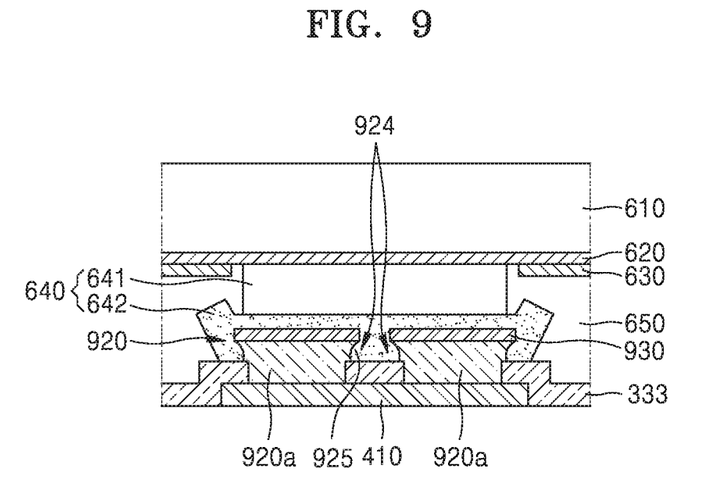

Referring to FIG. 9, a clamping portion 924 may be arranged between adjacent second conductive layers 920a and 920b included in a second conductive layer 920. The clamping portion 924 includes an undercut 925 arranged on opposite sidewalls of the adjacent second conductive layers 920a and 920b.

The second conductive layer 920 includes a conductive portion of at least one layer. The undercut 925 may correspond to a region where the sidewall of the second conductive layer 920 is curved.

Unlike in FIG. 8A, a third conductive layer 930 may be further arranged above the second conductive layer 920. The first conductive layer 410 may be arranged on the same plane as a gate electrode 308 of FIG. 11. The second conductive layer 920 may be arranged on the same plane as a second capacitor electrode CE2 of FIG. 11. The third conductive layer 930 may be arranged on the same plane as a source electrode 310 and a drain electrode 311 of FIG. 11.

According to an embodiment, the first to third conductive layers 410, 920, and 930 may be variously modified by combining a plurality of electrodes selected from among the gate electrode 308, the source electrode 310, the drain electrode 311, the capacitor electrodes CE1 and CE2, the first electrode 313, and the second electrode 315 of FIGS. 3 and 11.

Figure 10:
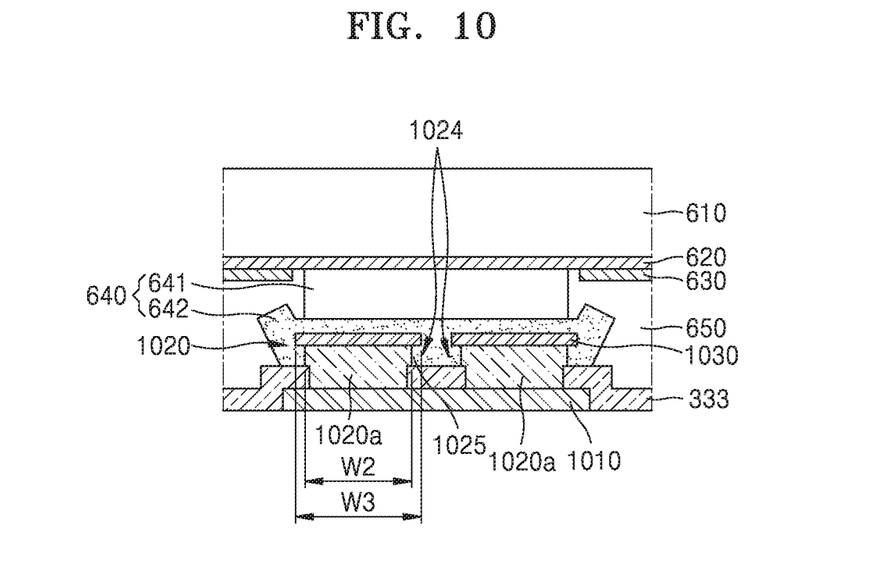

Referring to FIG. 10, a third conductive layer 1030 may be further arranged above a second conductive layer 1020. A clamping portion 1024 may be arranged between adjacent second conductive layers 1020a and 1020b included in the second conductive layer 1020. The clamping portion 1024 includes an undercut 1025 arranged on opposite sidewalls of the adjacent second conductive layers 1020a and 1020b.

The second conductive layer 1020 includes a conductive portion of at least one layer. The undercut 1025 may correspond to a region where a width W2 of the second conductive layer 1020 is different from a width W3 of the third conductive layer 1030. The width W2 of the second conductive layer 1020 may be narrower than the width W3 of the third conductive layer 1030.

The first conductive layer 1010 may be arranged on the same plane as the gate electrode 308 of FIG. 11. The second conductive layer 1020 may be arranged on the same plane as the second capacitor electrode CE2 of FIG. 11. The third conductive layer 1030 may be arranged on the same plane as the source electrode 310 and the drain electrode 311 of FIG. 11.

According to an embodiment, the first to third conductive layers 1010, 1020, and 1030 may be variously modified by combining a plurality of electrodes selected from the gate electrode 308, the source electrode 310, the drain electrode 311, the capacitor electrodes CE1 and CE2, the first electrode 313, and the second electrode 315 of FIGS. 3 and 11.

As described above, the display apparatus according to one or more embodiments is capable of improving a connection force between the pad and the driving terminal. Therefore, it is possible to improve connection reliability between the pad and the driving terminal.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a display substrate;
a plurality of driving terminals disposed above the display substrate;
a plurality of pads arranged above the display substrate in a pad area, each of the plurality of pads being connected to each of the plurality of driving terminals, respectively; and
a wiring connected to the each of the plurality of pads and extending from the pad area to a display area in a first direction,
wherein the each of the plurality of pads comprises:
a first conductive layer extending along the first direction;
an insulating film covering the first conductive layer;
a plurality of contact holes formed through the insulating film and exposing a top surface of the first conductive layer;
a plurality of second conductive layers spaced apart from each other in a plan view along a second direction substantially perpendicular to the first direction, connected to the first conductive layer through at least one of the plurality of contact holes, respectively, and arranged to overlap the first conductive layer in a plan view; and
a clamping portion disposed between the plurality of second conductive layers,
wherein the each of the plurality of driving terminals fully fills a space disposed on the first conductive layer between the adjacent second conductive layers, and
wherein the space overlaps the first conductive layer.

2. The display apparatus of claim 1, wherein
the plurality of second conductive layers are electrically connected to the first conductive layer through the plurality of contact holes.

3. The display apparatus of claim 1, wherein
the clamping portion comprises an undercut arranged on opposite sidewalls of adjacent second conductive layers.

4. The display apparatus of claim 3, wherein
the second conductive layer comprises conductive portions of multiple layers, and
the undercut is provided by forming the conductive portions of multiple layers to have different widths.

5. The display apparatus of claim 4, wherein
the second conductive layer comprises:
a first conductive portion connected to the first conductive layer;
a second conductive portion arranged above the first conductive portion; and
a third conductive portion arranged above the second conductive portion, and
the undercut corresponds to a region where a width of the second conductive portion is narrower than a width of the first conductive portion and a width of the third conductive portion.

6. The display apparatus of claim 3, wherein
the second conductive layer comprises a conductive portion of at least one layer, and
the undercut corresponds to a region where a sidewall of the second conductive layer is inclined.

7. The display apparatus of claim 3, wherein
the second conductive layer comprises a conductive portion of at least one layer, and
the undercut corresponds to a region where a sidewall of the second conductive layer is curved.

8. The display apparatus of claim 7, further comprising:
a third conductive layer arranged above the second conductive layer.

9. The display apparatus of claim 3, wherein
the second conductive layer comprises a conductive portion of at least one layer,
the display apparatus further comprises a third conductive layer arranged above the second conductive layer, and
a width of the second conductive layer in the undercut is narrower than a width of the third conductive layer.

10. The display apparatus of claim 1, further comprising
at least one thin-film transistor comprising a semiconductor active layer, a gate electrode, a source electrode, and a drain electrode above the display substrate and the display area; and
an organic light-emitting display device electrically connected to the thin-film transistor, the organic light-emitting display device comprising a first electrode, an emission layer, and a second electrode,
wherein an insulating film of at least one layer is arranged between the thin-film transistor and the organic light-emitting display device, and
the first conductive layer is connected to the wiring extending from any one of the gate electrode, the source electrode, the drain electrode, the first electrode, and the second electrode, and the second conductive layer is arranged to have an island shape above the first conductive layer.

11. The display apparatus of claim 10, wherein
the first conductive layer is formed of a same material as the gate electrode, and
the second conductive layer is formed of a same material as the source electrode and the drain electrode.

12. The display apparatus of claim 10, further comprising:
a third conductive layer arranged above the second conductive layer,
wherein the first to third conductive layers are a combination of a plurality of electrodes selected from the gate electrode, the source electrode, the drain electrode, the first electrode, and the second electrode.

13. A display apparatus comprising:
a display panel comprising a display substrate in which a plurality of pads are arranged and a thin-film encapsulation layer disposed on the display substrate; and
a driver comprising a plurality of driving terminals electrically connected to the plurality of pads and an adhesive arranged between the plurality of pads and the driver,
wherein each of the plurality of pads comprises:
  a first conductive layer, at least a portion of which is covered by an insulating film;
  a plurality of second conductive layers spaced apart from each other along a first direction, connected to the first conductive layer and arranged to overlap the first conductive layer along a second direction which is perpendicular to the first direction; and
  a clamping portion arranged between adjacent second conductive layers,
wherein the insulating film has a plurality of contact holes exposing a top surface of the first conductive layer,
wherein each of the plurality of second conductive layers is respectively connected to the first conductive layer through a contact hole of the plurality of contact holes,
wherein each of the plurality of driving terminals fills a space disposed on the first conductive layer between the adjacent second conductive layers,
wherein each of the plurality of second conductive layers comprises:
  a first conductive portion connected to the first conductive layer and having a first lower surface facing the first conductive layer and a first upper surface opposite to the first lower surface,
  a second conductive portion arranged above the first upper surface, and
  a third conductive portion arranged above the second conductive portion and having a third lower surface facing the first upper surface and a third upper surface opposite to the third lower surface,
wherein the space overlaps at least a portion of the first upper surface, at least a portion of the third lower surface, and the first conductive layer, and
wherein the at least the portion of the first upper surface and the at least the portion of the third lower surface directly contact the driving terminals.

14. The display apparatus of claim 13, wherein
the plurality of second conductive layers are electrically connected to the first conductive layers through the plurality of contact holes.

15. The display apparatus of claim 14, wherein
the clamping portion comprises an undercut arranged on opposite sidewalls of the adjacent second conductive layers.

16. The display apparatus of claim 15, wherein
the driving terminal fills a gap between the adjacent second conductive layers and contacts a sidewall of the second conductive layer in which the undercut is arranged.

17. The display apparatus of claim 16, wherein
the driving terminal extends over a region where the first conductive layer contacts the second conductive layer and between the adjacent second conductive layers.

18. The display apparatus of claim 13, wherein
the each of the plurality of pads is in surface contact with the driving terminal.

19. The display apparatus of claim 13, wherein
the adhesive comprises a non-conductive film.

20. A display apparatus comprising:
a display panel comprising a display substrate in which a plurality of pads are arranged; and
a driver comprising a plurality of driving terminals electrically connected to the plurality of pads, respectively,
wherein each of the plurality of pads comprises:
  a first conductive layer;
  an insulating layer disposed on the first conductive layer,
  and
  a plurality of second conductive layers spaced apart from each other along a first direction, overlapping the first conductive layer along a second direction which is perpendicular to the first direction, disposed on the insulating layer and connected to the first conductive layer through contact holes formed in the insulating layer and on the first conductive layer,
wherein each of the plurality of second conductive layers includes a clamping portion having an undercut and a material forming the plurality of driving terminals fills the undercut on the first conductive layer,
wherein the each of the plurality of second conductive layers comprises:
  a first conductive portion connected to the first conductive layer and having a first lower surface facing the first conductive layer and a first upper surface opposite to the first lower surface,
  a second conductive portion arranged above the first upper surface, and
  a third conductive portion arranged above the second conductive portion and having a third lower surface facing the first upper surface and a third upper surface opposite to the third lower surface,
wherein the material overlaps at least a portion of the first upper surface, at least a portion of the third lower surface, and the first conductive layer, and
wherein the at least the portion of the first upper surface and the at least the portion of the third lower surface directly contact the driving terminals.

21. The display apparatus of claim 20, wherein the undercut has a recessed portion recessed from an edge of the second conductive portion and the recessed portion is from about 1 μm to about 20 μm.

22. The display apparatus of claim 21, wherein the clamping portion is formed each center of the plurality of second conductive layers disposed on the first conductive layer.

23. The display apparatus of claim 21, wherein the clamping portion is formed between adjacent second conductive layers.

* * * * *